United States Patent
DeSoto et al.

(12) 
(10) Patent No.: US 6,278,297 B1
(45) Date of Patent: Aug. 21, 2001

(54) ROW DECODER WITH SWITCHED POWER SUPPLY

(75) Inventors: Stewart M. DeSoto, Addison; David B. Scott, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/395,592

(22) Filed: Sep. 14, 1999

Related U.S. Application Data

(60) Provisional application No. 60/101,001, filed on Sep. 18, 1998.

(51) Int. Cl.$^7$ .............................. G11C 8/00; H03K 19/084
(52) U.S. Cl. ......................... 326/108; 326/105; 326/106; 365/230.06
(58) Field of Search ................................ 326/105–106, 326/108, 68, 80–81; 365/230.06

(56) References Cited

U.S. PATENT DOCUMENTS

| | | | |
|---|---|---|---|
| 4,798,977 | * 1/1989 | Sakui et al. | 326/108 |
| 5,278,802 | * 1/1994 | Kersh, III et al. | 326/106 |
| 5,327,026 | * 7/1994 | Hardee et al. | 326/106 |
| 5,696,721 | 12/1997 | McAdams et al. | 365/189 |
| 5,825,205 | * 10/1998 | Ohtsuka | 326/81 |

OTHER PUBLICATIONS

Horenstein. Microelectronic Circuits and Devices. Prentice Hall: New Jersey. pp. 752–753, 1990.*

* cited by examiner

Primary Examiner—Michael Tokar
Assistant Examiner—Steven S. Paik
(74) Attorney, Agent, or Firm—Dwight N. Holmbo; Wade James Brady, III; Frederick J. Telecky, Jr.

(57) ABSTRACT

A circuit is designed with a decode circuit (313–315) having a first output terminal (319). The decode circuit is coupled to receive an address signal (81, 82, 85) having a first voltage range for producing a first output signal having one of a first and second logic levels. An output circuit (307, 309) is coupled to receive the first output signal and a power supply signal. The output circuit produces a second output signal having a second voltage range. A first latch transistor (301) is coupled to receive the second output signal. The first latch transistor is arranged to couple the first output terminal to a voltage terminal (209) in response to one of a first and second logic state of the second output signal. A second latch transistor (317) is coupled to receive the second output signal. The second latch transistor is arranged to couple the first output terminal to a reference terminal (318) in response to another of the first and second logic state of the second output signal.

9 Claims, 5 Drawing Sheets

ROW DECODER WITH SWITCHED POWER SUPPLY

This application claims priority under 35 USC §119(e)(1) of provisional application No. 60/101,001 filed Sep. 18, 1998.

FIELD OF THE INVENTION

This invention relates to an integrated circuit and more particularly to an integrated circuit with a row decoder having a switched power supply.

BACKGROUND OF THE INVENTION

Present complementary metal oxide semiconductor (CMOS) dynamic random access memory (DRAM) circuits are frequently used for main memory in a variety of applications including desk top and portable computer systems. These dynamic random access memory circuits frequently utilize memory cells formed by a single access transistor and a storage capacitor for storing an electrical charge representing a datum. An increasing demand for greater speed and cell density in dynamic random access memory circuits has been partially satisfied by reducing the operating voltage and the feature sizes of the memory cell. This reduction in operating voltage reduces the total charge that must be transferred to active signal lines. The reduction in feature sizes decreases load capacitance of the signal lines. Large capacitance signal lines such as word lines, however, still require large drive transistors to satisfy speed requirements. Moreover, active word lines of memory circuits organized in banks must be latched. These latched active word lines permit activation of word lines in alternate banks without deactivation of the first bank.

Row decode circuits of the prior art have segmented word lines to reduce load capacitance of each drive circuit. The decode circuit of FIG. 6 of the prior art includes thirty-six word line segment drive circuits 650 for each global row decode circuit 600. In operation, global word line signal /WLGS of the global row decode circuit 600 is precharged high by transistor 611. The global row decode circuit is selected when address signals turn on transistors 615 and 619, and block select signal /BSEL2 is driven low. The resulting current path discharges terminal 613 and drives global word line signal /WLGS low at each of the thirty-six word line segment drive circuits 650. This low level is not latched, and must be maintained, therefore, by the active state of the address signals and the block select signals. The X+ drive circuit of FIG. 5 selects one of the word line segment drive circuits 650. This X+ drive circuit includes a decode circuit 500 for producing drive signal /X+ and a buffering inverter 550 for producing complementary signal X+. These drive signals together with a low level of global word line select signal /WLGS produce a high level output signal WLa at word line lead 639.

Previous memory circuits have employed row decode circuits with level translators as disclosed in U.S. Pat. Nos. 5,668,485, 5,808,482 and 5,696,721. The row decode circuit of U.S. Pat. No. 5,696,721 disclosed in FIG. 7, for example, uses a level translator to increase the word line voltage and avoid a threshold voltage loss at the storage capacitor due to the access transistor. The row decode circuit is activated when block select signal BS_ is driven low and address signals RFJ and RFK are driven high. The resulting low signal at the control gate of transistor 706 couples the control gate of transistor 712 to high voltage supply Vpp, thereby activating word line drive circuit 722. The decode circuit is reset when block select signal BS_ goes high. This high level turns off transistor 704 and turns on transistor 710. In this state, transistors 706 and 710 are both conducting. Transistor 706 must have a width-to-length ratio designed for rapid activation of drive circuit 722. Transistor 710 must have a width-to-length ratio, however, that is sufficient to overcome transistor 706 and turn off the decode circuit. This conflict between transistor 706 and 710 is illustrated by the simulated waveforms of FIG. 8. Therein, a width of transistor 710 is held at 2.0 $\mu$m while the width of transistor 706 assumes widths of 0.8 $\mu$m, 3.0 $\mu$m and 6.0 $\mu$m. Although a width of 6.0 $\mu$m for transistor 706 might improve rise time of a word line in response to a low level of row address strobe signal RAS, the decode circuit fails to reset in response to the high level of row address strobe signal RAS. This failure to reset results in an intermediate state of the output signal and lost data along a word line that fails to turn off. A corresponding increase in the width of transistor 710 would have a disadvantage of requiring grater area for the decode circuit.

SUMMARY OF THE INVENTION

These problems are resolved by a decode circuit having a first output terminal and coupled to receive an address signal having a first voltage range. The decode circuit produces a first output signal having one of a first and second logic levels. An output circuit is coupled to receive the first output signal and a power supply signal. The output circuit produces a second output signal having a second voltage range. A first latch transistor is coupled to receive the second output signal. The first latch transistor is arranged to couple the first output terminal to a voltage terminal in response to one of a first and second logic state of the second output signal. A second latch transistor is coupled to receive the second output signal. The second latch transistor is arranged to couple the first output terminal to a reference terminal in response to another of the first and second logic state of the second output signal.

The power supply signal of the present invention eliminates the significance of relative widths of drive and reset transistors when the decode circuit is reset without an increase in required area.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
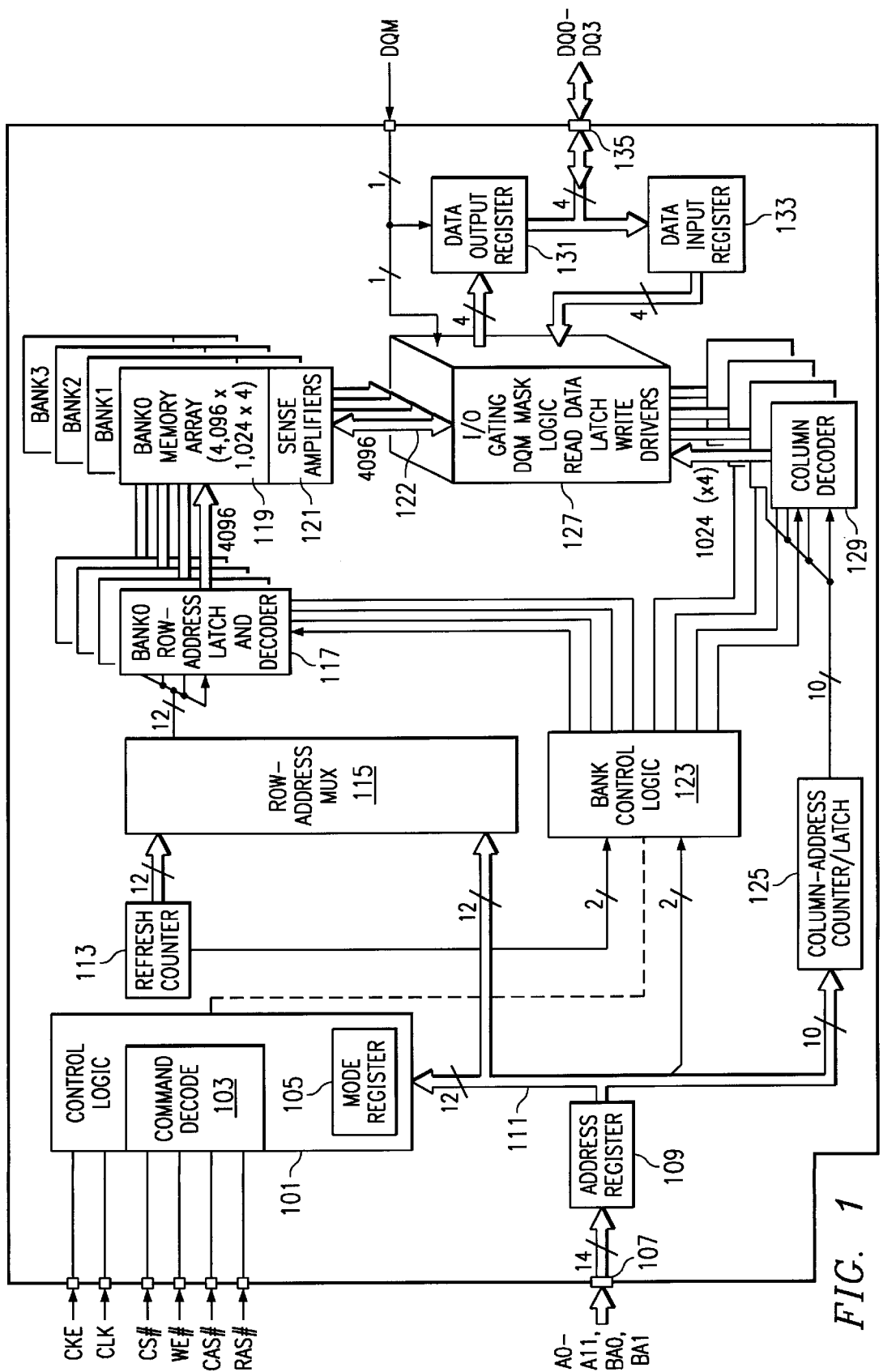
FIG. 1 is a block diagram of a memory device which may employ the row decode circuit of the present invention.

Referring now to FIG. 1, the synchronous dynamic random access memory device will be described in detail The memory device is organized as a 4 megabit, 4 bank and 4 bit architecture. In operation, the memory device receives commands such as bank activation, read and write commands in a control logic section 101. A bank activation command for activating one or more memory bank 119 precedes a read or write command. Data is read from an active row of an active bank as specified by row address strobe RAS# and row and bank address signals received at terminals 107 and stored in address register 109. Bank address signals are applied to bank control logic 123. Row address signals are applied to row address latch and decode circuitry 117 via row address mux 115. Consequently, a row of memory cells in one of sixteen blocks of a specified bank is activated when a word line (not shown) is driven high A column address strobe CAS# and column address signals are applied to the column decode circuitry via address register 109 and column address counter/latch circuit 125. This column address is decoded to select specific memory cells along the active row for reading or writing of data. This data then passes through data output register 131 or data input register 133, respectively.

A subsequent bank activation command and row address sequence may be used to activate another bank while the active word line in the previously activated bank remains high. The row decode circuit of the present invention accomplishes this task by latching the state of the final stage row decode circuit as will be explained in detail rather than by latching address signals applied to the row decode circuit. This method is highly advantageous, since it releases the address bus for conducting other address signals.

Figure 2:
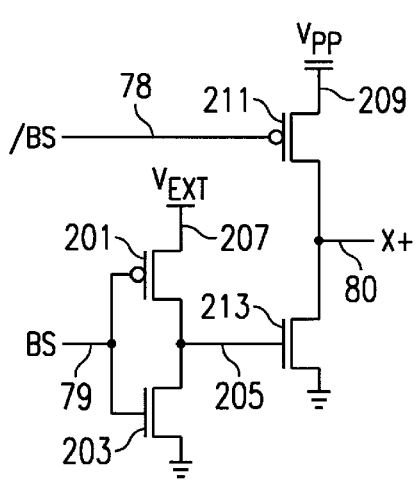
FIG. 2 is a schematic diagram of an X+ drive circuit for a row decode circuit of FIG. 1.

Referring now to FIG. 2, an X+ drive circuit that may be used with row decode circuit 117 of FIG. 1 will be described in detail. The X+ drive circuit receives block select signals BS and /BS, derived from a logical combination of row address bits A8–A11, on leads 78 and 79, respectively. Block select signal BS has a voltage range from reference voltage $V_{ss}$ to high voltage $V_{pp}$, preferably 3.1 V. Block select signal /BS has a voltage range from reference voltage $V_{ss}$ to external supply voltage $V_{EXT}$, preferably 2.5 V. Block select signal BS is low when the row decode circuit is disabled, and an inverter formed by transistors 201 and 203 produces a high level on lead 205, thereby turning on transistor 213. Block select signal /BS is high so that transistor 211 is off. Thus, when the X+ drive circuit is disabled, and transistor 213 holds the output terminal 80 to reference voltage $V_{ss}$. The X+ drive circuit is enabled when block select signal /BS goes low, thereby turning on transistor 211 and driving power supply signal X+ high.

Figure 3:
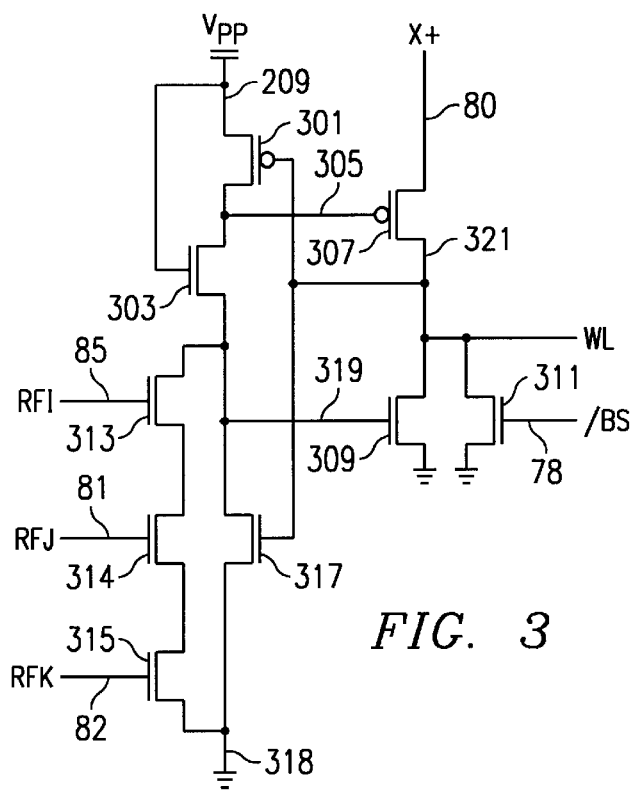
FIG. 3 is a schematic diagram of a row decode circuit of the present invention.

Turning now to FIG. 3, a row decode circuit of the present invention will be described in detail. When unselected, the row decode circuit has a low level reference voltage $V_{ss}$ at lead 321, thereby turning on transistor 301 and turning off transistor 317. Transistor 301 applies high voltage Vpp, preferably 3.1 V, to terminal 305. Transistor 303 applies high voltage Vpp less one transistor threshold voltage, preferably 2.1 V, to output terminal 319. These unselected or initial voltage levels turn off transistor 307 and turn on transistor 309, thereby latching word line signal WL at lead 321 to reference voltage Vss.

The row decode circuit is enabled when block select signal /BS on lead 78 goes low. This low level turns off transistor 311. Word line signal WL remains latched low, however, by transistor 309. The transition of block select signal /BS on lead 78 and block select signal BS on lead 79 causes the X+ drive circuit (FIG. 2) to drive power supply signal X+ from a reference voltage Vss level to a high voltage Vpp level. The row decode circuit is selected by a unique combination of address signals RFI, RFJ and RFK.

These address signals or row factors are predecoded logical combinations of address bits. For example, row factor set RFI includes a logical AND of all true and complementary combinations of row address bits A0–A1. Row factor sets RFJ and RFK include logical AND of combinations or row address bits A2–A4 and A5–A7, respectively. One active row factor or address signal from each set is applied to the selected row decode circuit, thereby turning on transistors 313–315 and coupling output terminal 319 to reference voltage terminal 318. This low level at output terminal 319 turns off transistor 309 and turns on transistor 303 which, in turn, drives output terminal 305 low, thereby establishing a transition current path through transistor 301 to reference terminal 318. The low level at output terminal 305, however, turns on transistor 307 and applies the high voltage level of power supply signal X+ to word line terminal 321. This high voltage level turns off transistor 301 and eliminates the transition current path. The high voltage level also turns on transistor 317, thereby latching output terminals 305 and 319 low and latching word line terminal 321 high. This latched state of the row decode circuit is highly advantageous in maintaining a high level word line signal WL. Moreover, address signals on leads 81, 82 and 85 may change to address another row decode circuit in another block or bank without resetting the state of word line signal WL at terminal 321.

The row decode circuit is disabled or reset when block select signal /BS on lead 78 goes high. This high level of block select signal /BS and a corresponding low level of block select signal BS on lead 79 (FIG. 2) drive power supply signal X+ low when transistor 311 (FIG. 3) turns on. Thus, the substantial capacitive load at word line terminal 321 is simultaneously discharged through transistor 311 and through a series connection of transistors 307 and 213 (FIG. 2). This discharge circuit is highly advantageous for several reasons. First, transistor 307 must be sufficiently wide to initially charge the word line load capacitance to meet data access time constraints. This substantial design width also facilitates discharge of the capacitive load. Second, the relative widths of transistor 307 and 311 are unimportant, since both simultaneously discharge the word line capacitance. This permits a small design width of transistor 311 without compromise of word line load discharge time. Finally, transistor 213 also has a small design width, since it is only necessary to discharge one word line load in the block at any time. Thus, substantial area is conserved by minimal design sizes of transistors 311 and 213. Reliable word line reset operation is assured, because current paths through transistors 307 and 311 discharge the word line load capacitance.

Figure 4:
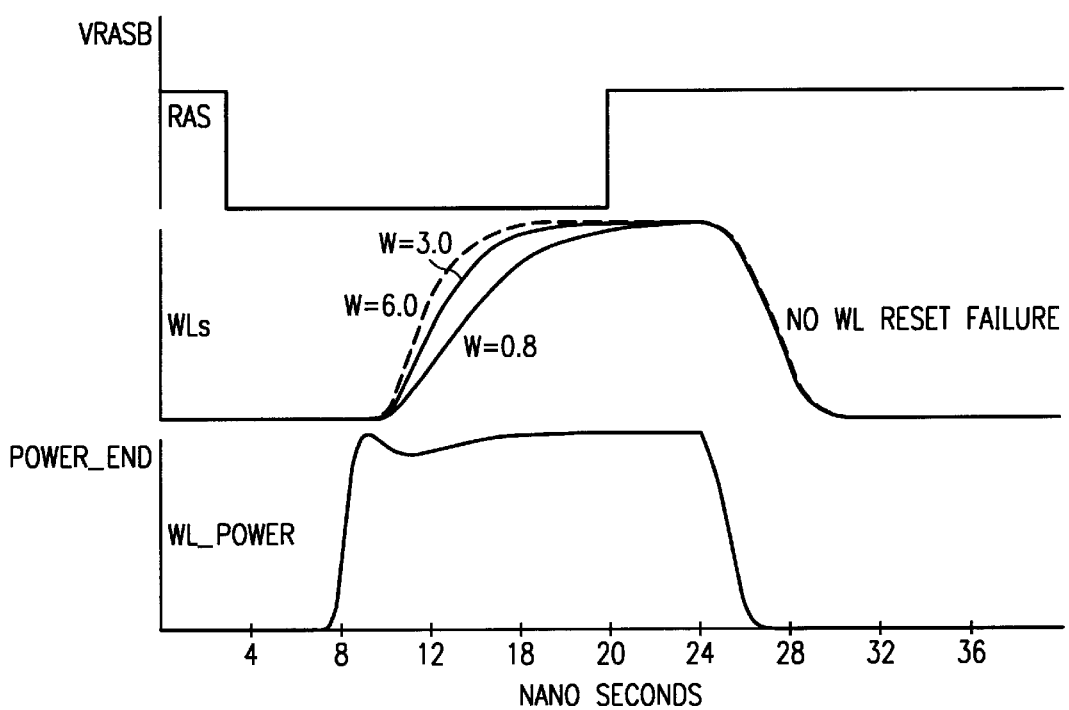
FIG. 4 is a timing diagram of the row decode circuit of FIG. 3.
Figure 5:
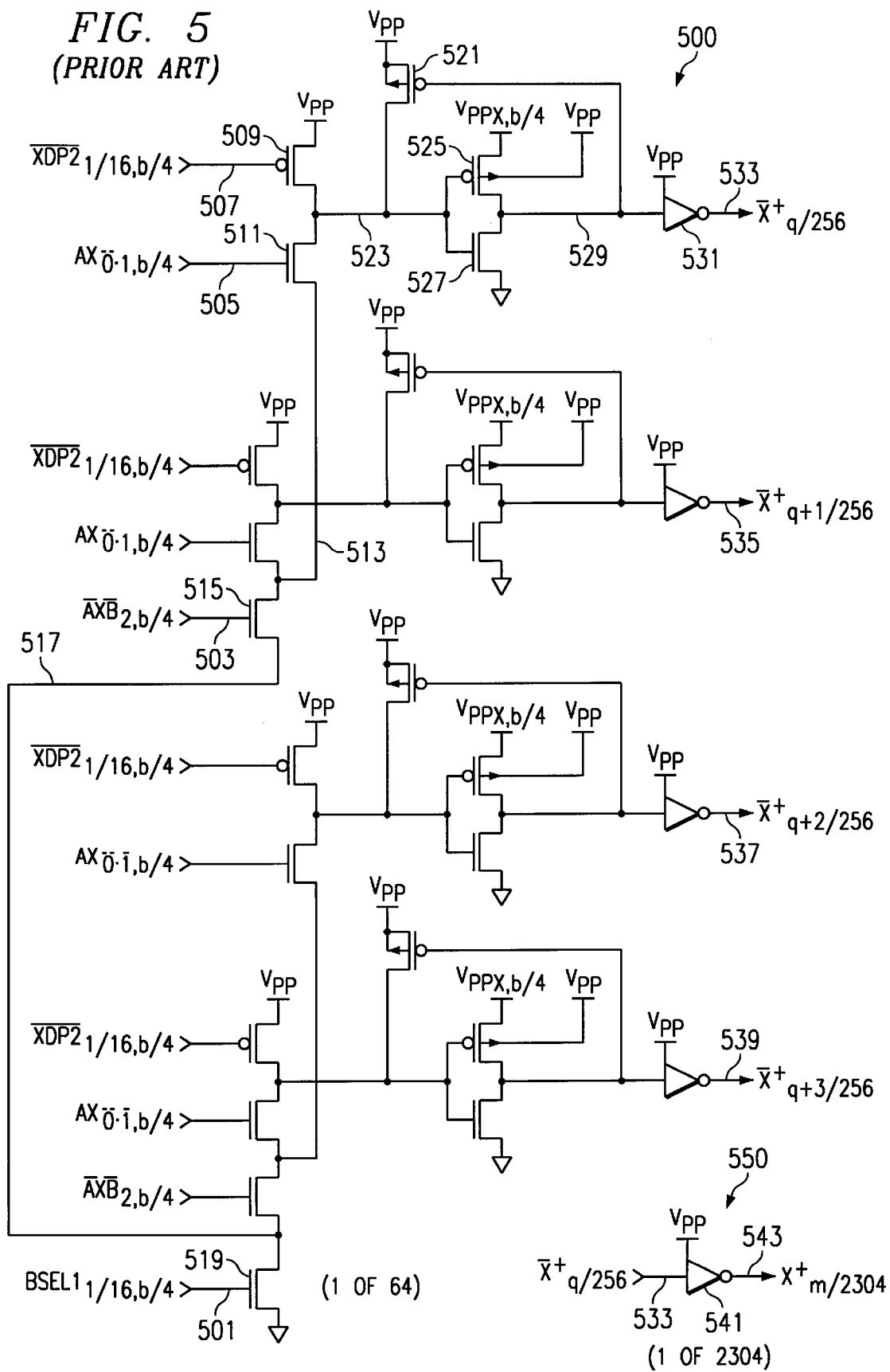
FIG. 5 is a schematic diagram of an X+ drive circuit of the prior art.
Figure 6:
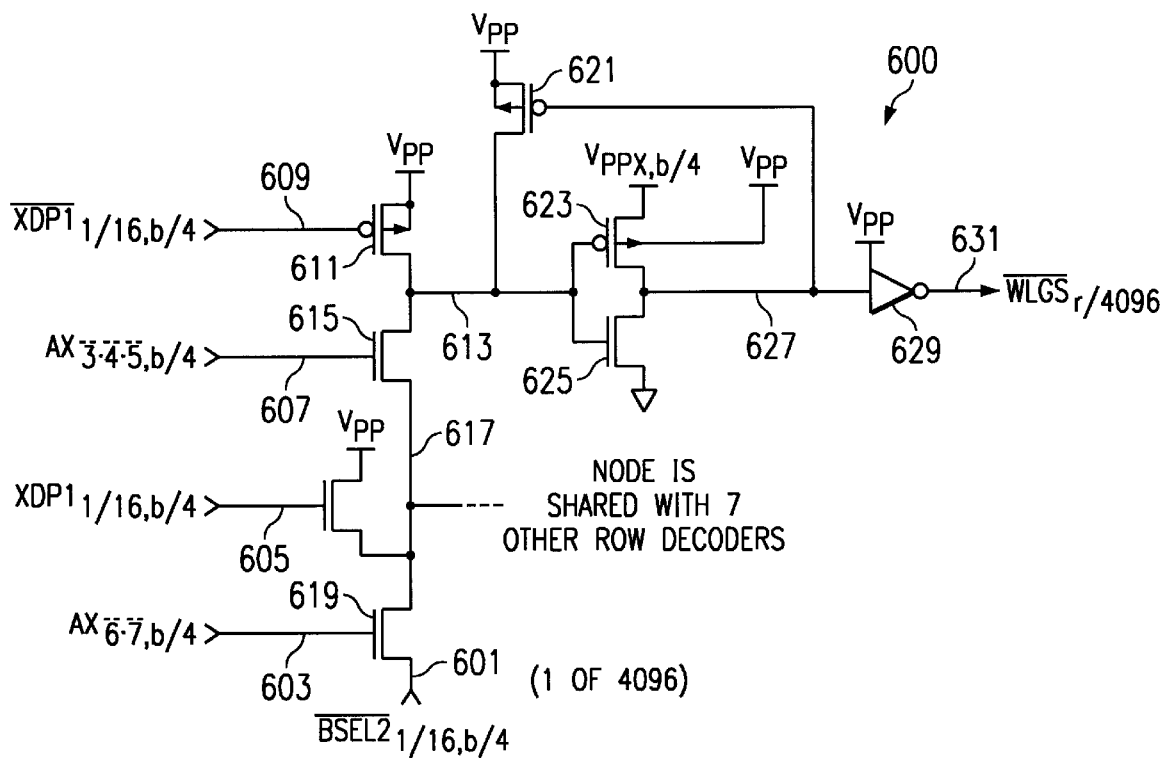
FIG. 6 is a schematic diagram of a row decode circuit of the prior art.
Figure 6:
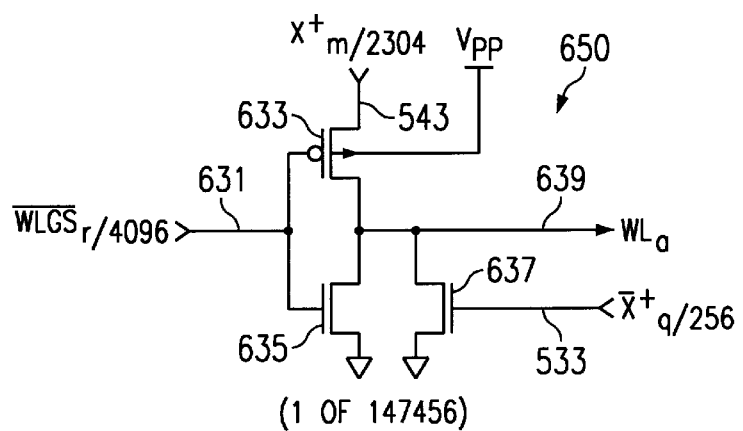
Figure 7:
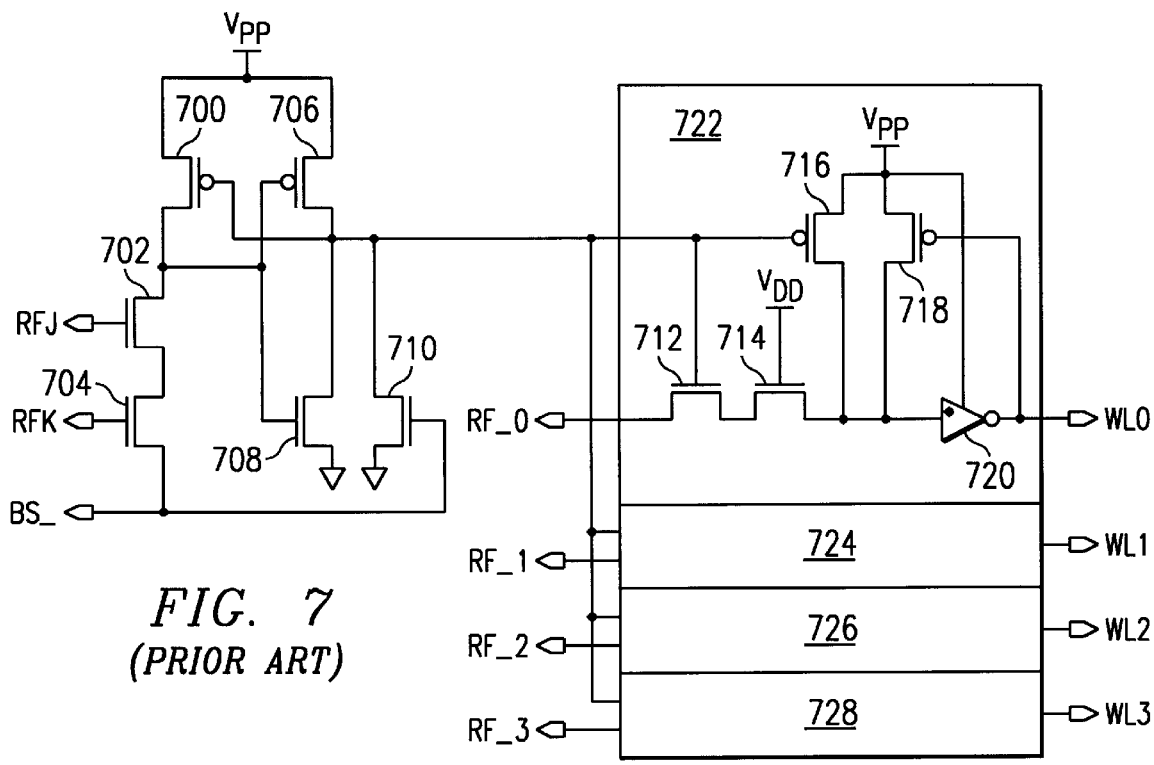
FIG. 7 is a schematic diagram of another row decode circuit of the prior art.
Figure 8:
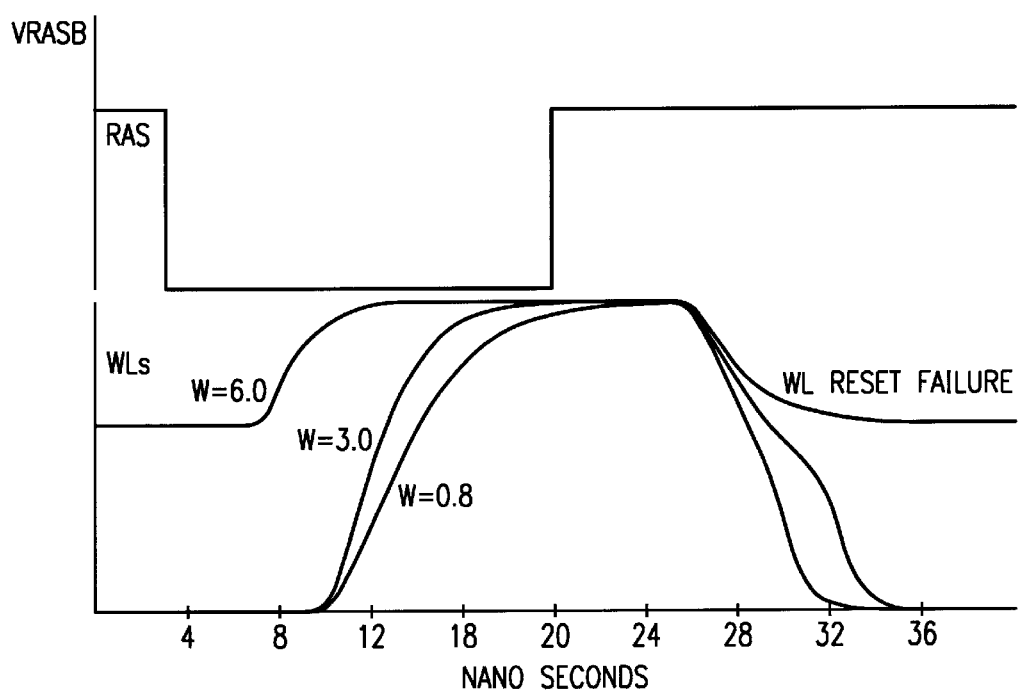
FIG. 8 is a timing diagram of the row decoder of FIG. 7.

A simulation of this word line signal WL reset is illustrated in FIG. 4. Therein, a width of transistor 311 is held at 2.0 μm while the width of transistor 307 assumes widths of 0.8 μm, 3.0 μm and 6.0 μm. A high to low transition of row address strobe signal RAS initiates the active cycle of the memory device. Word line power supply signal X+ is driven to high voltage supply level Vpp at 8 ns of simulation time. A width of 6.0 μm for transistor 307 provides a minimal rise time that is about 3 ns faster than a width of 0.8 μm for transistor 307. This faster rise time provides faster access to data stored in a selected memory cell in a read operation. The reset operation is initiated when row address strobe signal RAS returns to a high logic level. Block select signals BS and /BS drive word line power supply signal X+ low at 24 ns of simulation time in response to the row address strobe RAS transition. This low level of power supply signal X+ and the conductivity of transistor 311 (FIG. 3) discharge the word line capacitive load at substantially the same time for each width of transistor 307. Thus, an advantage of the present invention is that transistor 307 is designed to optimize word line rise time without compromise of word line reset effectiveness. Another advantage is that the width of transistor 311 may be designed to optimize word line discharge time.

Although the invention has been described in detail with reference to its preferred embodiment, it is to be understood that this description is by way of example only and is not to be construed in a limiting sense. For example, advantages of the instant invention would also be realized if transistors 211 and 213 were both turned off by respective block select signals. The resulting high impedance state at power supply signal lead 80 would also facilitate discharge of the word line load capacitance through transistor 311. Moreover, a transition of power supply signal X+ from high voltage level Vpp to a lesser voltage level of, for example, 2.5 V would reduce the current capacity of transistor 307, thereby improving word line reset time.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit, comprising:

a drive circuit having a first output terminal, the drive circuit arranged to produce a power supply signal at the first output terminal in response to a first address signal;

a plurality of decode circuits, each decode circuit having a respective second output terminal, each decode circuit coupled to receive a second address signal having a first voltage range, each decode circuit producing a respective second output signal at the respective second output terminal without receiving a precharge signal from a source external to the decode circuit, the respective second output signal having one of a first and second logic levels; and a plurality of output circuits, each output circuit coupled to the first output terminal each output circuit coupled to the respective second output terminal of a respective decode circuit, each output circuit producing a respective third output signal having a second voltage range.

2. A circuit as in claim 1, wherein each output circuit further comprises:

a first latch transistor coupled to receive the respective third output signal, the first latch transistor arranged to couple the respective second output terminal to a voltage terminal in response to one of a first and second logic state of the respective third output signal; and a second latch transistor coupled to receive the respective third output signal the second latch transistor arranged to couple the respective second output terminal to a reference terminal in response to another of the first and second logic state of the respective third output signal.

3. A circuit as in claim 1, further comprising a memory cell, responsive to the respective second output signal, for storing a datum.

4. A circuit as in claim 3, wherein each output circuit further comprises:

an output transistor arranged to conduct current during a transition of the respective third output signal from the first logic state to the second logic state and during a transition of the respective third output signal from the second logic state to the first logic state; and a reset transistor having a control gate coupled to receive the first address signal.

5. A circuit as in claim 4, wherein the output transistor has a width-to-length ratio at least twice a width-to-length ratio of the reset transistor.

6. A circuit as in claim 4, wherein the first address signal is a block select signal.

7. A circuit as in claim 3, wherein each decode circuit further comprises a respective plurality of decoding transistors, each decoding transistor having a control terminal, the control terminal of at least one of the decoding transistors receiving the second address signal for selectively producing the respective second output signal.

8. A circuit as in claim 7, wherein the second address signal comprises a plurality of address signals, each address signal comprising a logical combination of at least two address bits, the control terminal of each decoding transistor receiving one of the address signals.

9. A circuit as in claim 3, wherein the power supply signal has the second voltage range.

* * * * *